(12) United States Patent
Fujii et al.

(10) Patent No.: US 8,582,019 B2
(45) Date of Patent: Nov. 12, 2013

(54) IMAGE PICKUP ELEMENT AND IMAGE PICKUP DEVICE

(75) Inventors: Shinichi Fujii, Osaka (JP); Hiroki Ui, Tokyo (JP); Yutaka Nishimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 297 days.

(21) Appl. No.: 13/119,610

(22) PCT Filed: Sep. 2, 2009

(86) PCT No.: PCT/JP2009/065327
§ 371 (c)(1),
(2), (4) Date: Jul. 25, 2011

(87) PCT Pub. No.: WO2010/035616
PCT Pub. Date: Apr. 1, 2010

(65) Prior Publication Data
US 2011/0273581 A1    Nov. 10, 2011

(30) Foreign Application Priority Data

Sep. 24, 2008    (JP) ................................ 2008-244690

(51) Int. Cl.
*H04N 5/232*    (2006.01)
(52) U.S. Cl.
USPC .......................................... 348/350; 348/349
(58) Field of Classification Search
USPC ............ 348/345, 348, 350; 250/201.2, 201.8; 382/79, 80
See application file for complete search history.

(56) References Cited

U.S. PATENT DOCUMENTS

| 4,697,905 A | 10/1987 | Fujibayashi et al. |
| 6,781,632 B1 | 8/2004 | Ide |

(Continued)

FOREIGN PATENT DOCUMENTS

JP    61 133913    6/1986
(Continued)

OTHER PUBLICATIONS

International Search Report Issued Oct. 6, 2009 in PCT/JP09/065327 filed Sep. 2, 2009.

*Primary Examiner* — Tuan Ho
(74) *Attorney, Agent, or Firm* — Oblon, Spivak, McClelland, Maier & Neustadt, L.L.P.

(57) ABSTRACT

A technology of a phase-difference detecting image pickup element that can precisely detect a focus by a phase difference detection method and that can be properly produced even if pixels are becoming finer is provided. An image pickup element of an image pickup device includes an AF pixel pair 11*f* performing a pupil division function by receiving an object light beam transmitted through a pair of portions Qa, Qb in an exit pupil; and ordinary pixels that are not provided with the pupil division function. The AF pixel pair 11*f* includes a pair of photoelectric converters PD having the same size as photoelectric converters of the ordinary pixels and being disposed adjacent to each other in a horizontal direction. A light-intercepting section LS and one microlens ML are provided above the pair of photoelectric converters PD. The light-intercepting section LS has two light-intercepting areas Ea, Eb that intercept the light beam transmitted through the exit pupil. The one microlens ML is interposed between the two light-intercepting areas Ea, Eb. This makes it possible to realize an image pickup element that can precisely detect a focus by the phase difference detection method and that can be properly produced even if pixels are becoming finer.

10 Claims, 11 Drawing Sheets

(56) References Cited

U.S. PATENT DOCUMENTS

| | | | |
|---|---|---|---|
| 6,819,360 B1 * | 11/2004 | Ide et al. | 348/340 |
| 8,305,483 B2 * | 11/2012 | Fujii et al. | 348/345 |
| 8,319,882 B2 * | 11/2012 | Fujii et al. | 348/345 |
| 2007/0154200 A1 | 7/2007 | Utagawa et al. | |
| 2009/0153705 A1 | 6/2009 | Katsuda et al. | |

FOREIGN PATENT DOCUMENTS

| | | |
|---|---|---|
| JP | 2000 305010 | 11/2000 |
| JP | 2001 250931 | 9/2001 |
| JP | 2005 303409 | 10/2005 |
| JP | 2007 184716 | 7/2007 |
| JP | 2008 129360 | 6/2008 |

* cited by examiner

IMAGE PICKUP ELEMENT AND IMAGE PICKUP DEVICE

TECHNICAL FIELD

The present invention relates to a technology of an image pickup element capable of receiving a light beam of an object transmitted through an exit pupil of a shooting optical system.

BACKGROUND ART

In an image pickup device such as a single-reflex digital camera of a lens-replacement type, the use of an image pickup element (may hereunder be also referred to as a "phase-difference detecting image pickup element") is proposed. The image pickup element includes a plurality of pairs of photoelectric converters (photodiodes) and is capable of detecting a focus by a phase difference detection method. Each pair of photoelectric converters generates corresponding image signals by receiving light beams of an object transmitted through a corresponding pair of portions (such as a left pupil portion/a right pupil portion) in an exit pupil of an interchangeable lens (shooting optical system). Known examples of the image pickup element are as follows.

For example, PTL 1 discusses a phase-difference detecting image pickup element having a structure in which photoelectric converters are divided in two in ordinary pixels (RGB pixels) used for obtaining image signals of an object (such photoelectric converters are hereunder referred to as "half-size photoelectric converters"). That is, Patent Document 1 discusses a phase-difference detecting image pickup element in which a pair of half-size photoelectric converters are disposed below one microlens.

In addition, for example, PTL 2 discusses a phase-difference detecting image pickup element in which a light beam of an object is limited at a small opening in a light-intercepting mask using a metallic layer in a pair of adjacent pixels, so that a pair of portions of the exit pupil receive the light beam at a pair of photoelectric converters.

CITATION LIST

Patent Literature

PTL 1: Japanese Unexamined Patent Application Publication No. 2001-250931

PTL 2: Japanese Unexamined Patent Application Publication No. 2005-303409

SUMMARY OF INVENTION

Technical Problem

However, in the image pickup element discussed in PTL 1, transistors for converting outputs of the respective half-size photoelectric converters into electrical signals need to be set near the respective photoelectric converters. Therefore, it is necessary to reduce the sizes of the photoelectric converters in correspondence with their setting spaces, thereby reducing the amount of received light (that is, the sensitivity) at each of the photoelectric converters. This makes it difficult to precisely detect a focus by the phase difference detection method.

In contrast, in the image pickup element in PTL 2, since the light beam of the object is limited by the small opening in the light-intercepting mask for each pixel, when each pixel becomes finer due to, for example, increasing of pixelation of the image pickup element, it is demanded that the opening in the light-intercepting mask be even smaller. Such an opening may be difficult to form when manufacturing.

In view of such circumstances, it is an object of present invention to provide a technology of a phase-difference detecting image pickup element that can precisely detect a focus by the phase difference detection method and that can be properly produced even if pixels are becoming finer.

Solution to Problem

According to an aspect of the present invention, there is provided an image pickup element including a pair of first pixels that perform a pupil division function by receiving an object light beam transmitted through a pair of portions inclined in opposite directions along a predetermined direction in an exit pupil of a shooting optical system; and a second pixel group including second pixels that are not provided with the pupil division function. The second pixel group includes a plurality of photoelectric converters disposed at a predetermined pitch along the predetermined direction, and a plurality of microlenses provided above the respective photoelectric converters. The pair of first pixels include a pair of photoelectric converters having the same size as the plurality of photoelectric converters, the pair of photoelectric converters being disposed adjacent to each other at the predetermined pitch along the predetermined direction. A light-intercepting section and one microlens are provided above the pair of photoelectric converters, the light-intercepting section having two light-intercepting areas that intercept the light beam transmitted through the exit pupil, the one microlens being interposed between the two light-intercepting areas.

Advantageous Effects of Invention

According to the present invention, the image pickup element includes a pair of first pixels that perform a pupil division function by receiving an object light beam transmitted through a pair of portions inclined in opposite directions along a predetermined direction in an exit pupil of a shooting optical system; and a second pixel group including second pixels that are not provided with the pupil division function, and a plurality of photoelectric converters disposed at the predetermined pitch along the predetermined direction. In addition, the pair of first pixels include a pair of photoelectric converters having the same size as the second-pixel photoelectric converters and disposed adjacent to each other at the predetermined pitch along the predetermined direction. A light-intercepting section, having two light-intercepting areas that intercept the light beam transmitted through the exit pupil, and one microlens, interposed between these two light-intercepting areas, are provided above the pair of photoelectric converters. Such an image pickup element (phase-difference detecting image pickup element) can precisely detect a focus by the phase difference detection method and can be properly produced even if pixels become finer.

DESCRIPTION OF EMBODIMENTS

<First Embodiment>
[Structure of Main Portion of Image Pickup Device]

Figure 1:
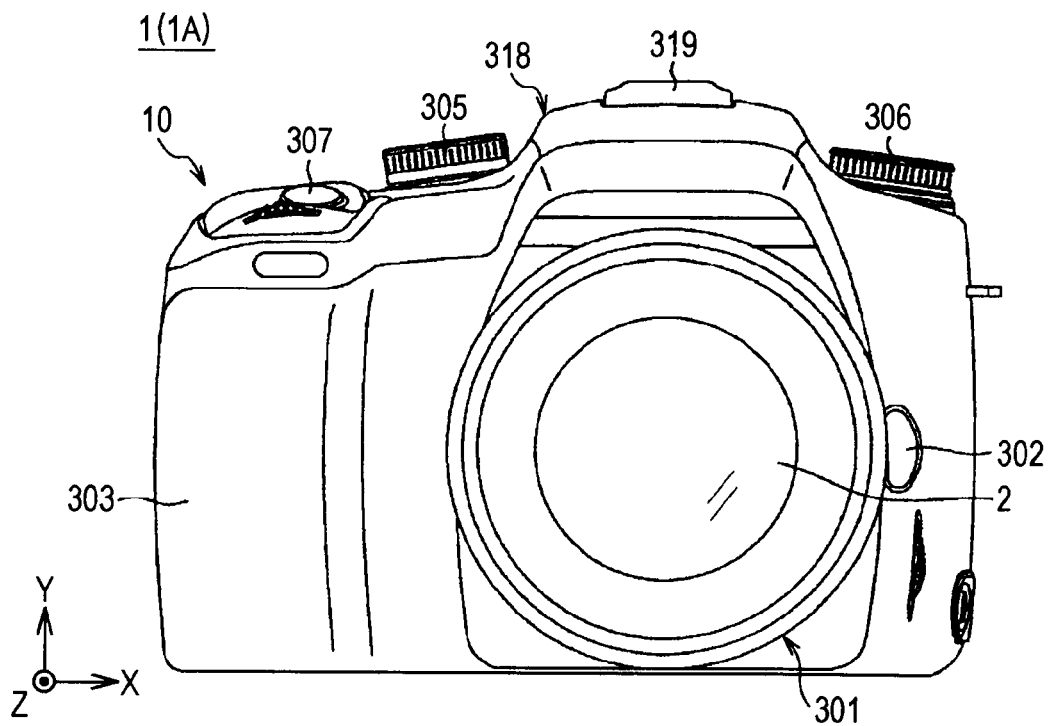
FIG. 1 shows an external structure of an image pickup device 1 according to a first embodiment of the present invention.
Figure 2:
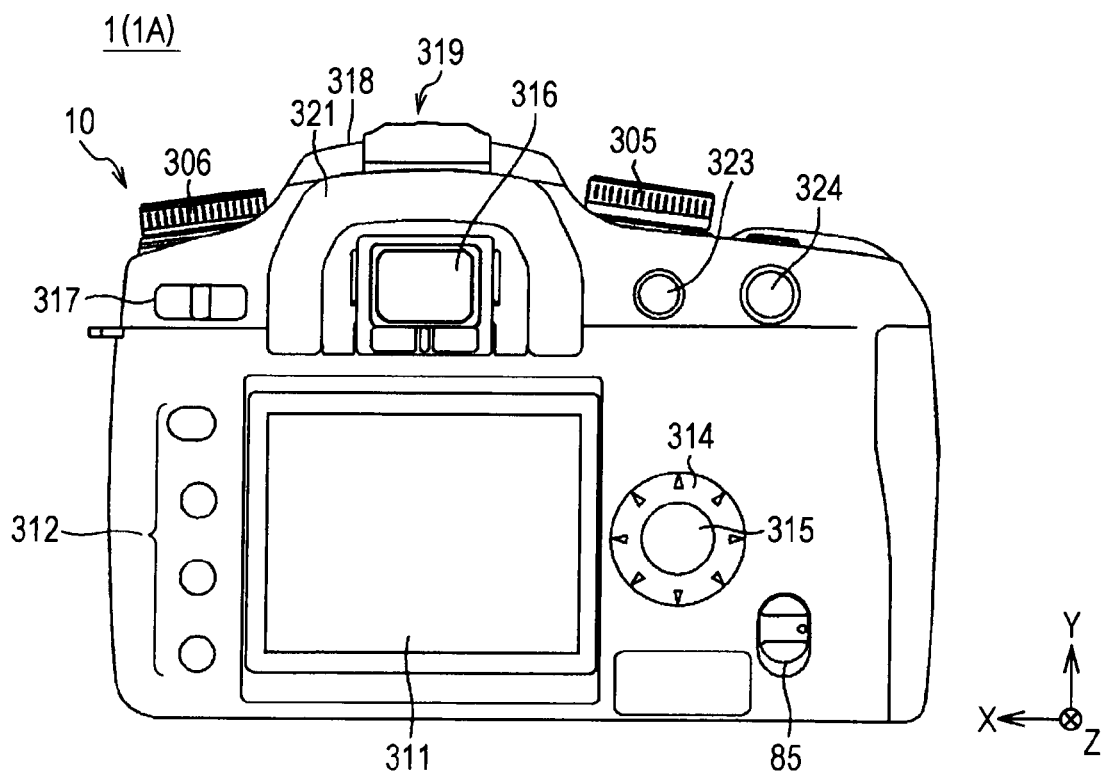
FIG. 2 shows an external structure of the image pickup device 1.

FIGS. 1 and 2 show external structures of an image pickup device 1 according to a first embodiment of the present invention. Here, FIGS. 1 and 2 are, respectively, a front view and a rear view thereof.

The image pickup device 1 is formed as, for example, a single-reflex digital still camera, and includes a camera body 10 and an interchangeable lens 2 serving as a shooting lens that is removable from the camera body 10.

In FIG. 1, the front side of the camera body 10 is provided with a mount section 301, a lens interchanging button 302, a grip section 303, a mode setting dial 305, a control-value setting dial 306, and a shutter button 307. The mount section 301 has the interchangeable lens 2 mounted thereto at substantially the center of the front surface of the camera body 10. The lens interchanging button 302 is disposed on the right side of the mount section 301. The grip section 303 can be gripped. The mode setting dial 305 is disposed at the upper left portion as seen from the front side of the camera body 10. The control-value setting dial 306 is disposed at the upper right portion as seen from the front side of the camera body 10. The shutter button 307 is disposed at the upper surface of the grip section 303.

In addition, in FIG. 2, the back side of the camera body 10 is provided with a LCD (liquid crystal display) 311, a setting button group 312, an arrow key 314, and a pushbutton 315. The setting button group 312 is disposed on the left of the LCD 311. The arrow key 314 is disposed on the right of the LCD 311. The pushbutton 315 is disposed in the center of the arrow key 314. Further, the back side of the camera body 10 is provided with an EVF (electronic view finder) 316, an eye cup 321, a main switch 317, an exposure correction button 323 and an AE lock button 324, and a flash section 318 and a connection terminal section 319. The EVF 316 is disposed above the LCD 311. The eye cup 321 surrounds the EVF 316. The main switch 317 is disposed on the left of the EVF 316. The exposure correction button 323 and the AE lock button 324 are disposed on the right of the EVF 316. The flash section 318 and the connection terminal section 319 are disposed above the EVF 316.

The mount section 301 has a connector Ec (see FIG. 4) for electrical connection with the mounted interchangeable lens 2 and with a coupler 75 (see FIG. 4) for mechanical coupling with the mounted interchangeable lens 2.

The lens interchanging button 302 is a button that is pressed when removing the interchangeable lens 2 mounted to the mount section 301.

The grip section 303 is a portion of the image pickup device 1 that a user grips when performing shooting, and has an uneven surface in accordance with the shapes of the fingers for increasing fittability. Furthermore, a battery accommodating chamber and a card accommodating chamber (not shown) are provided in the grip section 303. The battery accommodating chamber accommodates a battery 69B (see FIG. 4) as a power supply of the camera. The card accommodating chamber removably accommodates a memory card 67 (see FIG. 4) for recording image data of a shooting image. Furthermore, the grip section 303 may be provided with a grip sensor for detecting whether or not the user has gripped the grip section 303.

The mode setting dial 305 and the control-value setting dial 306 are substantially disc-shaped members that are rotatable in a plane substantially parallel to the top surface of the camera body 10. The mode setting dial 305 is provided for alternatively selecting functions or modes provided in the image pickup device 1, such as an automatic exposure (AE) control mode or an automatic focus (AF; autofocus) control mode, or various shooting modes (such as a still image shooting mode for shooting one still image or a continuous shooting mode for performing continuous shooting), or a reproduction mode for reproducing a recorded image. In contrast, the control-value setting dial 306 is provided for setting control values for the various functions of the image pickup device 1.

The shutter button 307 is a pushbutton that can be operated in a partially pressed state and in a completely pressed state reached by further pressing the shutter button 307. When the shutter button 307 is partially pressed in the still image shooting mode, preparation operations for shooting a still image of an object (such as setting an exposure control value or detecting a focus) are executed. When the shutter button 307 is completely pressed, shooting operations (including a series of operations in which an image pickup element 101 (see FIG. 3) is exposed, a predetermined image processing operation is performed on an image signal obtained by the exposure, and the image signal is recorded on, for example, the memory card) are executed.

The LCD 311 includes a color liquid crystal panel capable of displaying an image. The LCD 311, for example, reproduces and displays a recorded image or displays an image picked up by the image pickup element 101 (see FIG. 3), and provides a function or mode setting screen display of the image pickup device 1. Instead of the LCD 311, an organic EL or a plasma display device may also be used.

The setting button group 312 includes buttons for performing the various functions of the image pickup device 1. The setting button group 312 includes, for example, a selection confirmation switch for confirming selected content at a menu screen-displayed on the LCD 311, a selection cancel switch, a menu display switch for switching the content of the menu screen, a display on/off switch, and a display enlargement switch.

The arrow key 314 includes an annular member provided with a plurality of pressing portions (illustrated triangular portions) disposed at constant intervals in a circumferential direction, and is formed so that pressing of the pressing portions by contacts (switches) provided in correspondence with the respective pressing portions is detected. In addition, the pushbutton 315 is disposed at the center of the arrow key 314. The arrow key 314 and the push button 315 are provided for inputting instructions of, for example, setting shooting conditions (such as a diaphragm stop value, shutter speed, existence/absence of flash light generation), advancing of frames of recorded images reproduced by, for example, the LCD 311, and changing shooting magnification (moving a zoom lens 212 (see FIG. 4) in a wide-angle direction or a telephoto direction).

Figure 3:
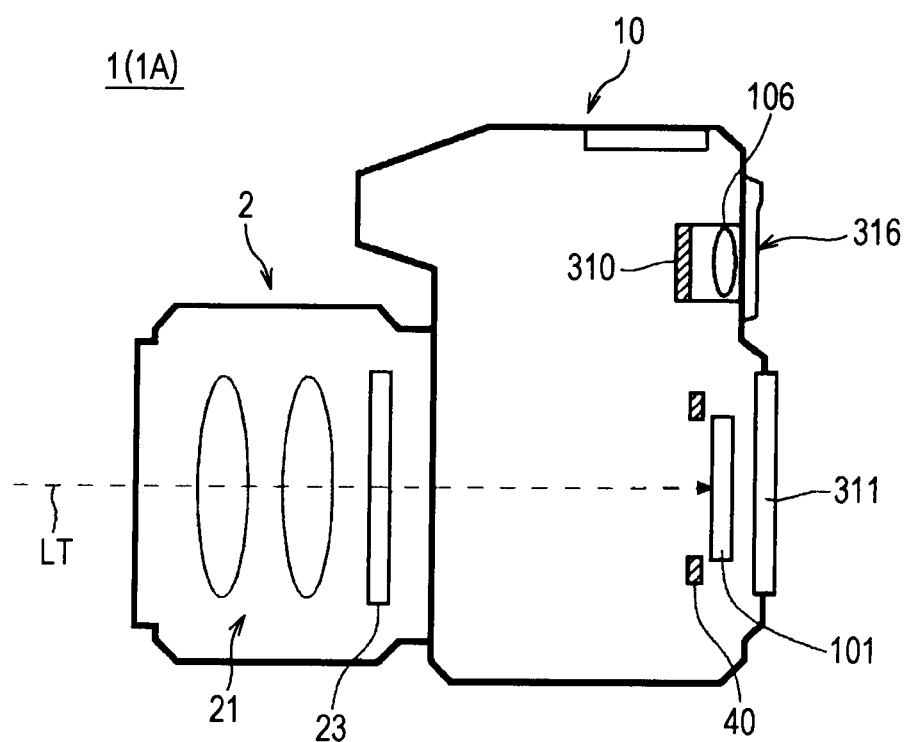
FIG. 3 is a vertical sectional view of the image pickup device 1.

The EVF 316 includes a liquid crystal panel 310 (see FIG. 3), and, for example, reproduces and displays a recorded image or displays an image picked up by the image pickup element 101 (see FIG. 3). At the EVF 316 and the LCD 311, the user can visually recognize an object that is actually shot by the image pickup element 101 by performing a live view (preview) display in which the object is dynamically displayed on the basis of image signals successively generated by the image pickup element 101 prior to the actual shooting (shooting for image recording).

The main switch 317 is a two-contact slide switch that slides towards the left and right. When the main switch 317 is set to the left, a power supply of the image pickup device 1 is turned on, whereas, when it is set to the right, the power supply of the image pickup device 1 is turned off.

The flash section 318 is formed as a pop-up type built-in flash section. On the other hand, when, for example, an external flash section is mounted to the camera body 10, the connection terminal section 319 is used for connecting it to the camera body 10.

The eye cup 321 is a C-shaped light-intercepting member having light-intercepting properties and restricting entry of external light to the EVF 316.

The exposure correction button 323 is a button for manually adjusting an exposure value (diaphragm stop value or shutter speed). The AE lock button 324 is a button for fixing the exposure.

The interchangeable lens 2 functions as a lens window that takes in light (an optical image) from an object, and as a shooting optical system for guiding the object light to the image pickup element 101 disposed in the camera body 10. By pressing the aforementioned lens interchanging button 302, the interchangeable lens 2 can be removed from the camera body 10.

Figure 4:
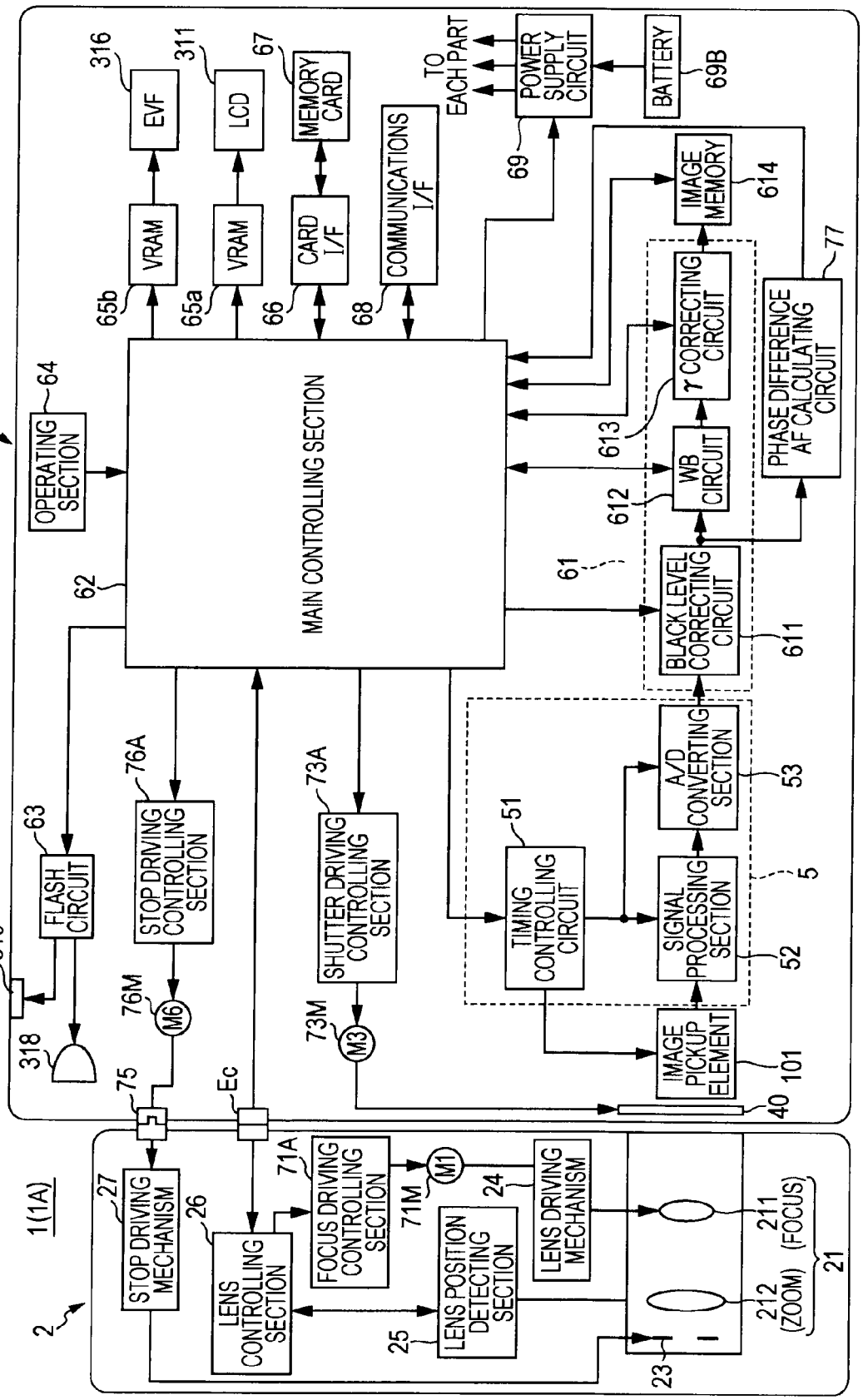
FIG. 4 is a block diagram of an electrical structure of the image pickup device 1.

The interchangeable lens 2 is provided with a lens group 21 including a plurality of lenses disposed in series along an optical axis LT (see FIG. 4). The lens group 21 includes a focus lens 211 for focusing (see FIG. 4) and a zoom lens 212 for changing magnification (see FIG. 4). By driving the focus lens 211 and the zoom lens 212 in the direction of the optical axis LT (see FIG. 3), focusing is performed and magnification is changed. An operating ring that can be rotated around the outer peripheral surface of a barrel is provided at a suitable location of the outer periphery of the barrel of the interchangeable lens 2. By manual or automatic operation, the zoom lens 212 is moved in accordance with the direction and the amount of rotation of the operating ring, so that a zoom magnification (shooting magnification) is set in accordance with the position of its destination.

[Internal Structure of Image Pickup Device 1]

Next, the internal structure of the image pickup device 1 will be described. FIG. 3 is a vertical sectional view of the image pickup device 1. As shown in FIG. 3, the image pickup element 101, the EVF 316, etc., are provided in the camera body 10.

The image pickup element 101 is disposed perpendicularly to the optical axis LT of the lens group of the interchangeable lens 2 when the interchangeable lens 2 is mounted to the camera body 10. As the image pickup element 101, a CMOS color area sensor (a CMOS image pickup element) is used. In the CMOS color area sensor, a plurality of pixels including, for example, photodiodes are two-dimensionally disposed in a matrix. The image pickup element 101 generates analog electrical signals (image signals) of corresponding color components, R (red), G (green), and B (blue), of object light beams received through the interchangeable lens 2, and outputs the image signals of the corresponding colors R, G, and B. The structure of the image pickup element 101 will be described in detail below.

A shutter unit 40 is disposed in front of the image pickup element 101 along the optical axis. The shutter unit 40 is formed as a mechanical focal plane shutter that includes a vertically moving curtain member and that opens and closes an optical path of the object light guided to the image pickup element 101 along the optical axis LT by an opening and a closing operation of the curtain member. The shutter unit 40 can be omitted when the image pickup element 101 is one that allows use of a complete electronic shutter.

The EVF 316 includes the liquid crystal panel 310 and an eyepiece 106. The liquid crystal panel 310 is formed as, for example, a color liquid crystal panel that can display an image, and can display an image picked up by the image pickup element 101. The eyepiece 106 guides an object image displayed on the liquid crystal panel 310 to the outer side of the EVF 316. By virtue of such a structure of the EVF 316, a user can see an object shot with the image pickup element 101.

[Electrical Structure of Image Pickup Device 1]

FIG. 4 is a block diagram of an electrical structure of the image pickup device 1. For example, members corresponding to those shown in FIGS. 1 to 3 are given the same reference numerals. Furthermore, for convenience of explanation, first, an electrical structure of the interchangeable lens 2 will be described.

In addition to the lens group 21 of the aforementioned shooting optical system, the interchangeable lens 2 is provided with a lens driving mechanism 24, a lens position detecting section 25, a lens controlling section 26, and a stop driving mechanism 27.

In the lens group 21, the focus lens 211, the zoom lens 212, and a stop 23 for adjusting the amount of light that is incident upon the image pickup element 101, provided in the camera body 10, are held along the optical axis LT (FIG. 3) in the barrel. The lens group 21 takes in an optical image of an object, and focuses it on the image pickup element 101. In AF control, focusing is performed by driving the focus lens 211 by an AF actuator 71M, disposed in the interchangeable lens 2, in the direction of the optical axis LT.

On the basis of an AF control signal applied from a main controlling section 62 through the lens controlling section 26, a focus driving controlling section 71A generates a driving control signal to the AF actuator 71M required for moving the focus lens 211 to its focus position. The AF actuator 71M is formed of, for example, a stepping motor, and applies lens driving power to the lens driving mechanism 24.

The lens driving mechanism 24 includes, for example, a helicoid and a gear (not shown) that rotates the helicoid. The lens driving mechanism 24 receives the driving power from the AF actuator 71M, and drives, for example, the focus lens 211 in a direction parallel to the optical axis LT. The direction and amount of movement of the focus lens 211 are in accordance with the direction of rotation and the number of rotations of the AF actuator 71M, respectively.

The lens position detecting section 25 includes an encode plate and an encoder brush, and detects the amount of movement of the lens group 21 when focusing the lens group 21. In the encode plate, a plurality of code patterns are formed at a predetermined pitch in the direction of the optical axis LT within a range of movement of the lens group 21. The encoder brush moves together with a lens while sliding along and contacting the encode plate. The position of the lens detected by the lens position detecting section 25 is output as, for example, the number of pulses.

The lens controlling section 26 includes, for example, a microcomputer having a memory, such as ROM, which stores, for example, a control program, or a flash memory, which stores data regarding condition information.

Further, the lens controlling section 26 has a communication function for communicating with the main controlling section 62 in the camera body 10 through the connector Ec. This makes it possible to send, for example, condition data (such as the focal length, the exit pupil position, the diaphragm stop value, the focus distance, and the light quantity of a peripheral area of the lens group 21) and information of the position of the focus lens 211, detected by the lens position detecting section 25, to the main controlling section 62. In addition, this makes it possible to receive, for example, data of a driving amount of the focus lens 211 from the main controlling section 62.

The stop driving mechanism 27 receives driving power from a stop driving actuator 76M through the coupler 75, and changes the stop diameter of the stop 23.

Next, an electrical structure of the camera body 10 will be described. In addition to the previously described image pickup element 101, the shutter unit 40, etc., the camera body 10 includes an AFE (analog front end) 5, an image processing section 61, an image memory 614, the main controlling section 62, a flash circuit 63, an operating section 64, VRAM 65 (65a, 65b), a card interface (I/F) 66, the memory card 67, a communications interface (I/F) 68, a power supply circuit 69, the battery 69B, a shutter driving controlling section 73A, a shutter driving actuator 73M, a stop driving controlling section 76A, and the stop driving actuator 76M.

The image pickup element 101 is formed of a CMOS color area sensor as mentioned above. A timing controlling circuit 51 (described later) controls image pickup operations such as reading out a pixel signal, selecting an output of each pixel of the image pickup element 101, and starting (and ending) an exposure operation of the image pickup element 101.

The AFE 5 applies a timing pulse that causes the image pickup element 101 to carry out a predetermined operation, performs a predetermined signal processing operation on image signals output from the image pickup element 101 (that is, on an analog signal group received at the pixels of the CMOS area sensor), converts the image signals into digital signals, and outputs the digital signals to the image processing section 61. The AFE 5 includes, for example, the timing controlling circuit 51, a signal processing section 52, and an A/D converting section 53.

On the basis of a reference clock output from the main controlling section 62, the timing controlling circuit 51 generates predetermined timing pulses (that cause, for example, a vertical scanning pulse $\phi Vn$, a horizontal scanning pulse $\phi Vm$, and a reset signal $\phi Vr$ to be generated), outputs the predetermined timing pulses to the image pickup element 101, and controls the image pickup operations of the image pickup element 101. In addition, by outputting the predetermined timing pulses to the signal processing section 52 and the A/D converting section 53, the operations of the signal processing section 52 and the A/D converting section 53 are controlled.

The signal processing section 52 performs a predetermined analog signal processing operation on the analog image signals output from the image pickup element 101. The signal processing section 52 includes, for example, a CDS (correlated double sampling) circuit, an AGC (auto gain control) circuit, and a clamp circuit. On the basis of the timing pulses output from the timing controlling circuit 51, the A/D converting section 53 converts the analog R, G, and B image signals output from the signal processing section 52 into digital image signals of a plurality of bits (such as 12 bits).

The image processing section 61 performs a predetermined signal processing operation on image data output from the AFE 5, and forms an image file. The image processing section 61 includes, for example, a black level correcting circuit 611, a white balance controlling circuit 612, and a gamma correcting circuit 613. The image data taken in by the image processing section 61 is written to the image memory 614 once in synchronism with the reading out of the image pickup element 101. Then, the image data written to the image memory 614 is accessed, so that an operation is carried out in each block of the image processing section 61.

The black level correcting circuit 611 corrects a black level of each of the R, G, and B digital image signals subjected to A/D conversion by the A/D converting section 53 to a reference black level.

On the basis of a white standard corresponding to a light source, the white balance correcting circuit 612 performs level conversion (white balance (WB) adjustment) on the digital signals of the corresponding R (red), G (green), and B (blue) color components. That is, on the basis of WB adjustment data applied from the main controlling section 62, the white balance correcting circuit 612 specifies a portion that is presumed to be actually white from, for example, color saturation data and brightness of a shooting object; determines the average of the R, G, and B color components of this portion; determines a G/R ratio and a G/B ratio; and corrects these levels as correction gain of R and B.

The gamma correcting circuit 613 corrects gradation characteristics of the image data subjected to the WB adjustment. More specifically, the gamma correcting circuit 613 performs nonlinear conversion using a gamma correction table, in which an image data level is previously set for each color component, and performs an offset adjustment.

In a shooting mode, the image memory 614 is a memory used as a working area that temporarily stores the image data output from the image processing section 61 and that is used for carrying out a predetermined operation on the image data by the main controlling section 62. In addition, a reproduction mode, the image memory 614 temporarily stores the image data read out from the memory card 67.

The main controlling section 62 includes, for example, a microcomputer in which a storage section such as ROM, which stores a control program, or RAM, which temporarily stores data, is built in, and controls the operation of each section of the image pickup device 1.

In a flash shooting mode, the flash circuit 63 controls the amount of light emission of the flash section 318 or an external flash section, connected to the connection terminal section 319, to the amount of light emission set by the main controlling section 62.

The operating section 64 includes, for example, the mode setting dial 305, the control-value setting dial 306, the shutter button 307, the setting button group 312, the arrow key 314, the pushbutton 315, and the main switch 317. The operating section 64 inputs operation information to the main controlling section 62.

The VRAMs 65a and 65b are buffer memories which are provided between the main controlling section 62 and the LCD 311 and between the main controlling section 62 and the EVF 316, respectively, and which have storage capacities for storing image signals corresponding to the number of pixels of the LCD 311 and the EVF 316. The card I/F 66 is an interface that makes possible signal transmission and reception between the memory card 67 and the main controlling section 62. The memory card 67 is a recording medium that stores image data generated by the main controlling section 62. The communications I/F 68 is an interface for making possible transmission of, for example, the image data to a personal computer or to other external devices.

The power supply circuit 69 is, for example, a constant voltage circuit, and generates a voltage for driving the entire image pickup device 1, such as the controlling sections (the main controlling section 62, etc.), the image pickup element 101, and the various other driving sections. Furthermore, controlling of application of current to the image pickup element 101 is carried out on the basis of a control signal applied to the power supply circuit 69 from the main controlling section 62. The battery 69B is a primary battery, such as an alkaline dry battery, or a secondary battery, such as a nickel metal hydride rechargeable battery, and is a power supply that supplies electrical power to the entire image pickup device 1.

On the basis of the control signal applied from the main controlling section 62, the shutter driving controlling section 73A generates a driving control signal to the shutter driving actuator 73M. The shutter driving actuator 73M is an actuator that performs a driving operation for opening and closing the shutter unit 40.

On the basis of a control signal applied from the main controlling section 62, the stop driving controlling section 76A generates a driving control signal to the stop driving actuator 76M. The stop driving actuator 76M applies driving power to the stop driving mechanism 27 through the coupler 75.

In addition, the camera body 10 includes a phase difference AF calculating circuit 77 that performs required calculations during autofocus (AF) control using the image pickup element 101, on the basis of image data output from the black level correcting circuit 611 and provided after black level correction.

Next, a phase difference AF operation of the image pickup device 1 using the phase difference AF calculating circuit 77 will be described.

[Phase Difference AF Operation of Image Pickup Device 1]

The image pickup device 1 is formed so that it can perform focus detection (phase difference AF) using the phase difference detection method by receiving transmission light transmitted through different portions of the exit pupil in the image pickup element 101. The structure of the image pickup element 101 and the principles of the phase difference AF making use of the image pickup element 101 will be described below.

Figure 5:
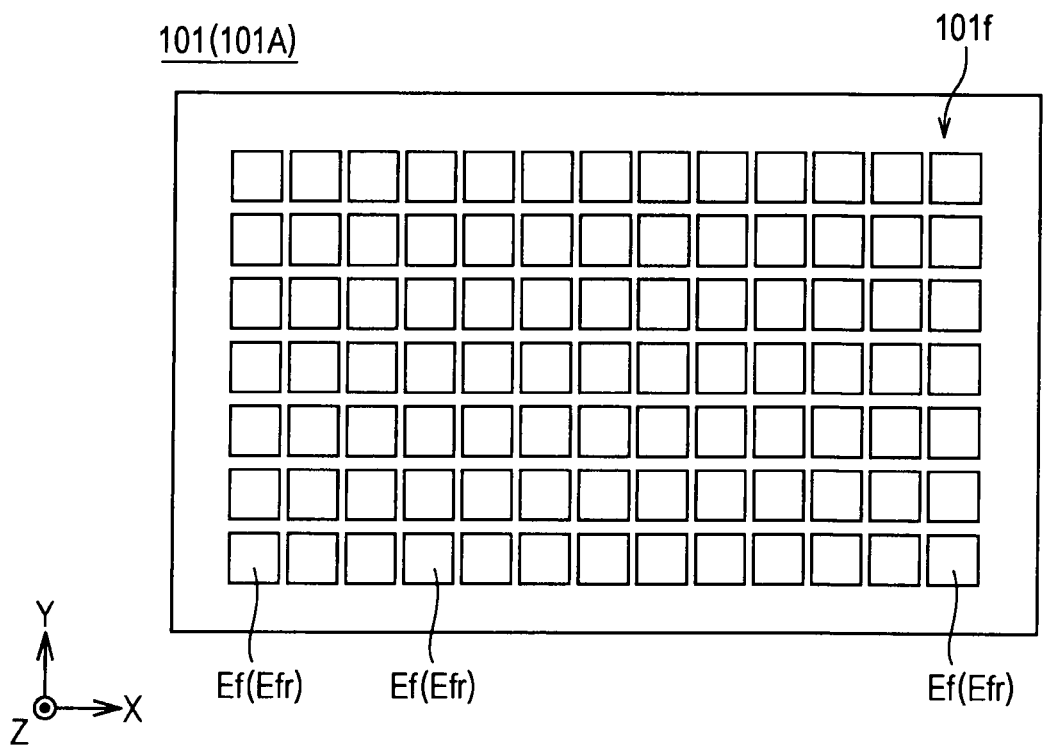
FIG. 5 illustrates the structure of an image pickup element 101.
Figure 6:
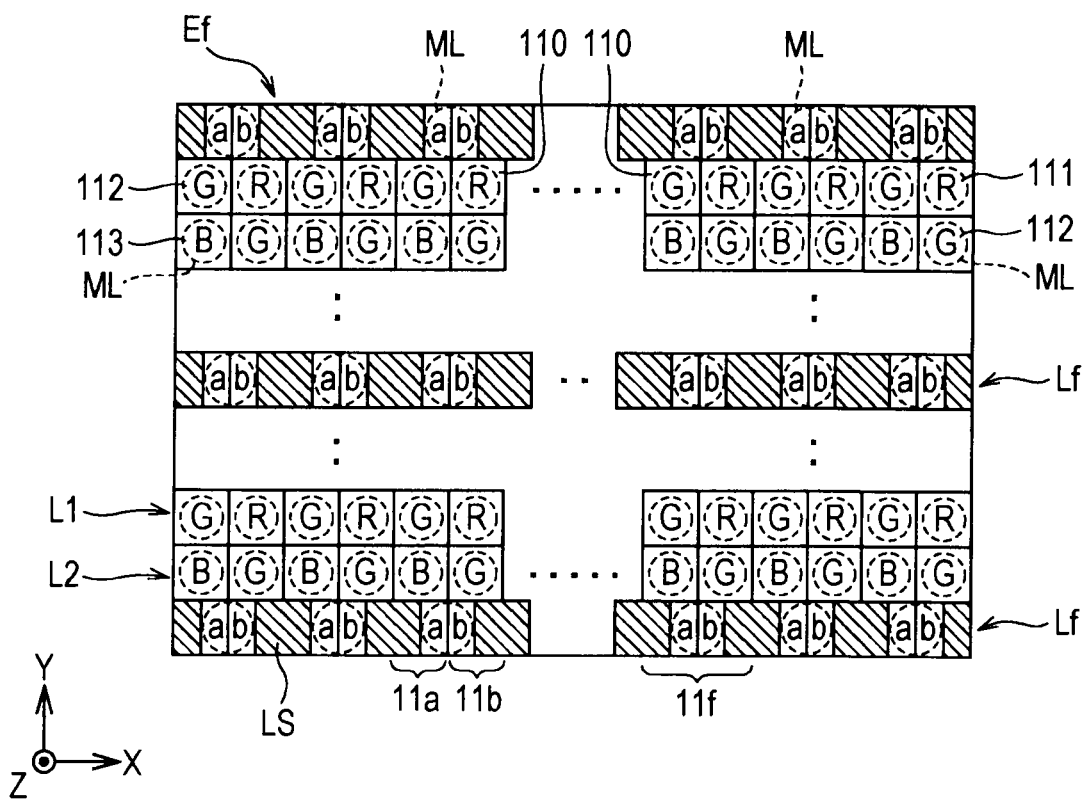
FIG. 6 illustrates the structure of the image pickup element 101.

FIGS. 5 and 6 each illustrate the structure of the image pickup element 101.

The image pickup element 101 is formed so that it can perform focus detection using the phase difference detection method at each of a plurality of AF areas Ef provided in accordance with a matrix in an image pickup surface 101f (FIG. 5).

Each AF area Ef is provided with pixels that are ordinary (hereunder may also be referred to as "ordinary pixels") 110 including R pixels 111, G pixels 112, and B pixels 113 at which respective R (red) color filters, G (green) color filters, and blue (B) color filters are disposed between photodiodes and microlenses ML (illustrated by a broken circle) functioning as condensing lenses. At the same time, each AF area Ef is provided with pixel pairs (may hereunder be referred to as "AF pixel pairs") 11f for performing a pupil division function for carrying out the phase difference AF (FIG. 6). In such AF areas Ef, in principle, image information of an object is obtained on the basis of the ordinary pixels 110 which are larger in number than the pixels of the AF pixel pairs 11f.

In addition, each AF area Ef is provided with Gr lines L1 and Gb lines L2. The Gr lines L1 and the Gb lines L2 are horizontal lines (may hereunder be referred to as "ordinary pixel lines") of the ordinary pixels (second pixels) 110 that are not provided with the above-described pupil division function. The Gr lines L1 have the G pixels 112 and the R pixels 111 alternately disposed horizontally. The Gb lines L2 have the B pixels 113 and the G pixels 112 alternately disposed horizontally. By alternately disposing the Gr lines L1 and the Gb lines L2 vertically, a Bayer pattern of groups of the ordinary pixels 110 (second pixel groups) is provided.

In addition, in the AF areas Ef, the AF pixel pairs 11f each including one microlens ML having the same structural features (diameter and curvature) as those of the ordinary pixels 110 are repeatedly disposed horizontally, so that AF lines Lf (first pixel pair arrangement) in which a plurality of the AF pixel pairs 11f are arranged adjacent to each other are vertically disposed periodically. Furthermore, it is desirable to provide between the vertically adjacent AF lines Lf the number of ordinary pixel lines (such as four or more ordinary pixel lines) necessary for interpolation of image information of an object that is missing at an AF line Lf. Here, a combination of two ordinary pixel lines vertically adjacent to the Af lines Lf may be a combination of the same type of horizontal lines (such as the Gr lines L1 or the Gb lines L2), or may be a combination of different types of horizontal lines (such as a Gr line L1 and a Gb line L2).

Next, the differences between the structures of the ordinary pixels 110 and the Af pixel pairs 11f will be described. First, the structure of the ordinary pixels 110 will be described.

Figure 7:
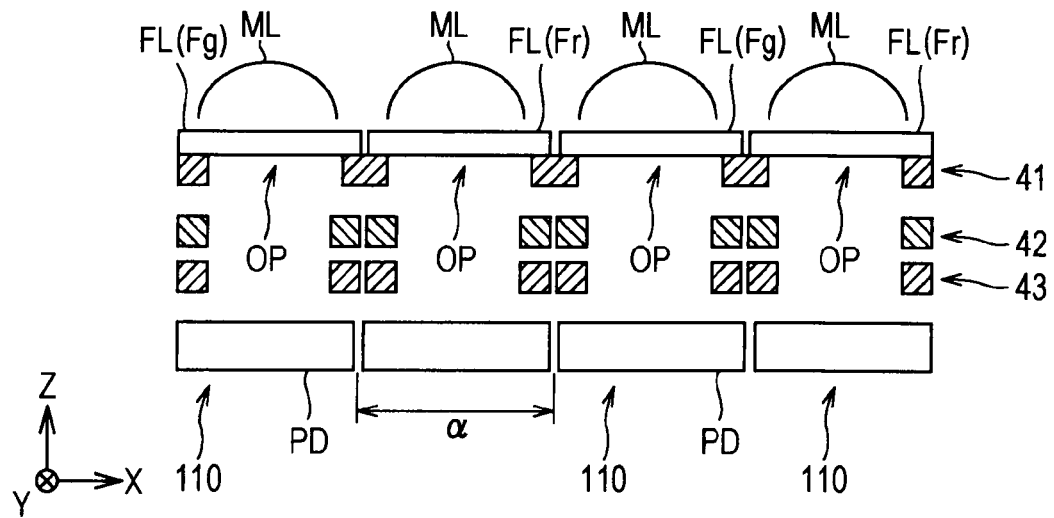
FIG. 7 is a vertical sectional view illustrating the structures of ordinary pixels 110.

FIG. 7 is a vertical sectional view illustrating the structures of the ordinary pixels 110. The ordinary pixels 110 shown in FIG. 7 are arranged in, for example, the Gr line L1 (FIG. 6).

In the arrangement of the ordinary pixels 110, the microlenses ML are provided above respective photoelectric converters (photodiodes) PD disposed at a pitch α in the horizontal direction. Three metallic layers, more specifically, a first metal 41, a second metal 42, and a third metal 43 disposed in that order from the top), are disposed between the microlenses ML and the photoelectric converters PD. Here, the second metals 42 and the third metals 43 are formed as wires that transmit electrical signals (in FIG. 7, the wires are disposed perpendicularly to a sheet plane). The first metals 41 are ground surfaces. Color filters FL are disposed on the first metals 41, and the microlenses ML are provided above the color filters FL. Regarding the color filters FL, for example, in the arrangement of the ordinary pixels 110 disposed in the Gr line L1, a green filter Fg and a red filter Fr are alternately disposed as shown in FIG. 7.

In addition, the arrangement of the ordinary pixels 110, in order to prevent unnecessary light transmitted between the microlenses ML from being received by the photoelectric converters PD, the first metals 41 intercept the light coming from between the microlenses ML. That is, the first metals 41 function as light-intercepting mask layers in which openings OP are formed directly below the microlenses ML.

Next, the structures of the AF pixel pairs 11$f$ will be described.

Figure 8:
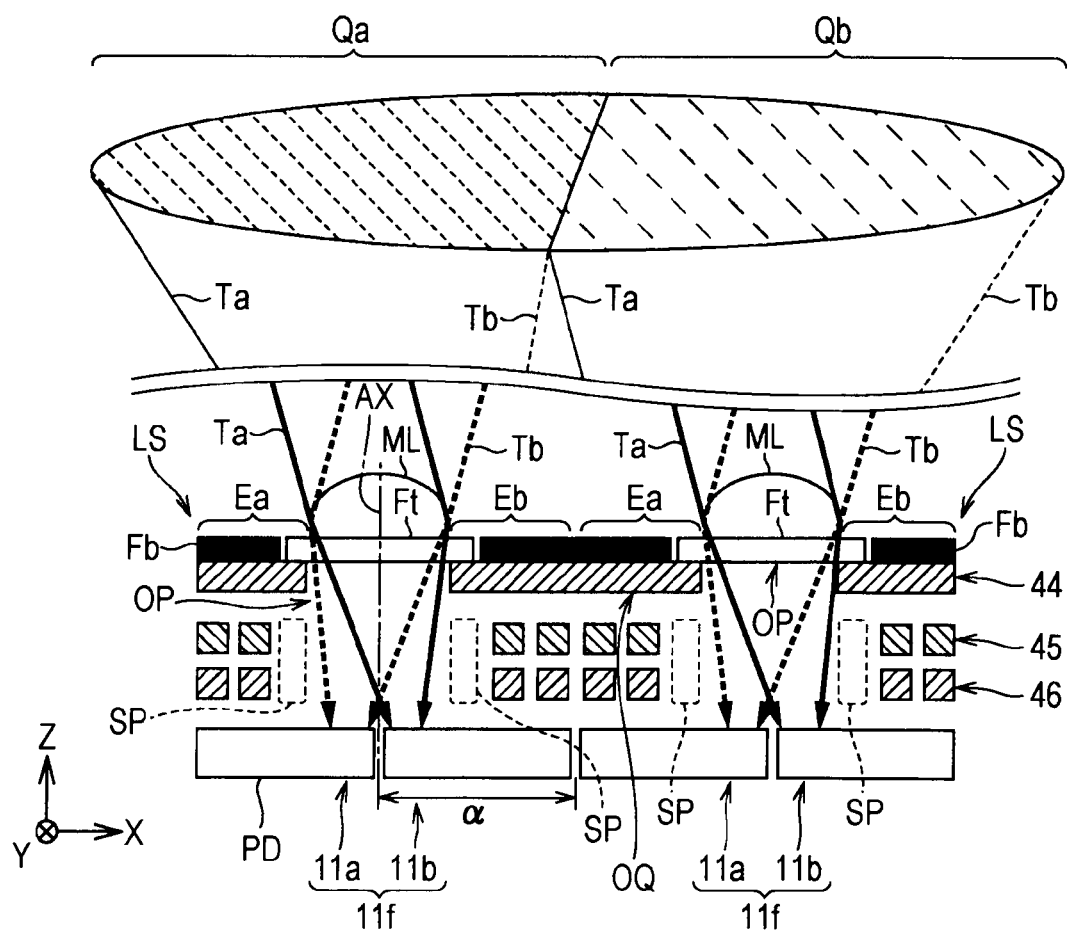
FIG. 8 is a vertical sectional view illustrating the structures of AF pixel pairs 11f.
Figure 9:
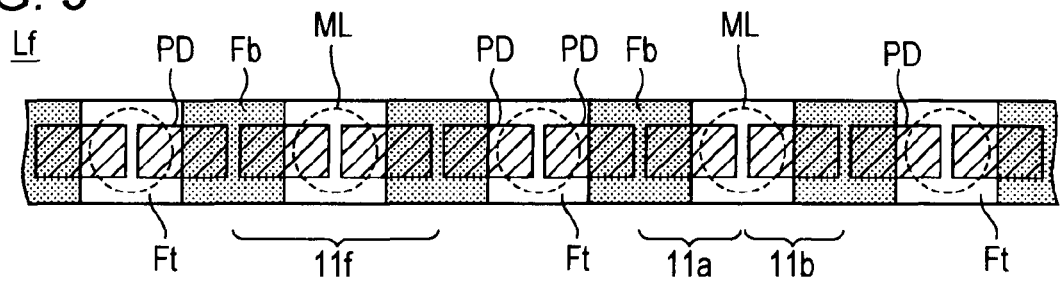
FIG. 9 is a plan view illustrating the structures of the AF pixel pairs 11f.

FIGS. 8 and 9 are, respectively, a vertical sectional view and a plan view of the structures of the AF pixel pairs 11$f$. Furthermore, the AF pixel pairs 11$f$ shown in FIGS. 8 and 9 are arranged in the AF line Lf (FIG. 6).

As shown in FIG. 8, each AF pixel pair 11$f$ includes a pair of pixels (a pair of first pixels) 11$a$ and 11$b$ at which two photoelectric converters PD are disposed on opposite sides of an optical axis AX of the corresponding microlens ML for dividing a light beam Ta from a left portion Qa of the exit pupil associated with the interchangeable lens 2 and a light beam Tb from a right portion Qb of the exit pupil associated with the interchangeable lens 2 (that is, for performing pupil division). The sizes of the pairs of photoelectric converters PD are each the same as that of the photoelectric converters PD (FIG. 7) of the ordinary pixels 110. The pairs of photoelectric converters PD are horizontally disposed adjacent to each other at a pitch α, which is the same as the pitch of the ordinary pixels 110.

In each such AF pixel pair 11$f$, for performing precise pupil division, it is desirable that the space existing between the photoelectric converter PD of the pixel (may hereunder be referred to as the "first AF pixel") 11$a$ and the photoelectric converter PD of the pixel (may hereunder be referred to as the "second AF pixel") 11$b$ be small. Therefore, in the image pickup element 101 according to the embodiment including the photoelectric converters PD that are elongated in the horizontal direction as shown in FIG. 9, it is suitable to dispose the AF pixel pairs 11$f$ in the longitudinal direction, that is, the horizontal direction of the photoelectric converters PD. Consequently, the AF lines Lf according to the embodiment are formed by disposing two or more AF pixel pairs 11$f$ in the horizontal direction.

In addition, in the schematic structure in the arrangement of the AF pixel pairs 11$f$, members that are disposed above the photoelectric converters PD, that is, the first to third metals, the color filters, and the microlenses are shifted by half a pitch in the horizontal direction compared with those in the arrangement of the ordinary pixels 110 shown in FIG. 7. That is, the relationship in the arrangement between the microlenses ML and one pair of photoelectric converters PD in each AF pixel pair corresponds to a configuration arrangement when particular microlenses ML, corresponding to microlenses ML of the AF pixel pair 11$f$, among the microlenses ML in the ordinary pixel line are shifted by half of the pitch α (a predetermined amount) in the horizontal direction with respect to the photoelectric converters PD. Then, by providing light-intercepting sections LS between the particular microlenses ML that are adjacent to each other in the configuration arrangement, the arrangement of the Af pixel pairs 11$f$ (the AF line Lf) is provided. Accordingly, since the AF line Lf can be provided by slightly changing the layout of the ordinary pixel line, it is possible to simplify the layout and production of the AF line Lf. The structure of the light-intercepting sections LS provided between the adjacent microlenses ML in the AF line Lf will be described in more detail below.

In the AF line Lf, as shown in FIGS. 8 and 9, light is intercepted by every other first metal 44 with respect to the openings OP (FIG. 7) of the first metals 41 provided in the arrangement of the ordinary pixels 110. That is, in order to increase the precision of the phase difference AF by bringing the adjacent AF pixel pairs 11 closest to each other, the interval of the light-intercepting sections LS, provided between the corresponding adjacent microlenses ML in the AF line Lf, is equal to the interval between every other pixel in the arrangement of the ordinary pixels 110 disposed horizontally in the ordinary pixel line. More specifically, a location OQ (FIG. 8) in which the opening OP is formed in the arrangement of the ordinary pixels 110 shown in FIG. 7 is blocked by the first metal 44. A black color filter (black filter) Fb is disposed on the first metal 44 for every other pixel. Since ghost flare is generated as a result of reflection of light incident from the interchangeable lens 2 when the upper surfaces of the first metals 44 are uncovered, the black filter Fb is disposed on the corresponding first metal 44 in this way for restricting the ghost flare by absorbing the reflected light. Therefore, in each AF pixel pair 11$f$ according to the embodiment, the light-intercepting sections LS are disposed above the corresponding pair of photoelectric converters PD. The light-intercepting sections LS include the black filters Fb and the first metals 44, formed at a plurality of the locations OQ, and two light-intercepting areas Ea and Eb that intercept the light beams of an object transmitted through the exit pupil. In such light-intercepting sections LS, the black filters Fb and the first metals (metallic layers) 44 intercept light, so that the light can be properly and easily intercepted. In addition, in each AF pixel pair 11$f$, one microlens ML interposed between the two light-intercepting areas Ea and Eb and extending towards the center from above respective ends of the pair of photoelectric converters PD is provided.

In each AF line Lf, transparent filters Ft are used as color filters provided above the openings OP of the first metals 44. This increases the amount of light received by the AF pixel pairs 11$f$, and increases sensitivity.

Further, in each AF line Lf, in order to provide a large optical path directly below the openings OP of the first metals 44, the second metals 45 and the third metals 46 are disposed away from the spaces directly below the openings OP. That is, compared to the structure of the ordinary pixels 110 shown in FIG. 7, the second metals 45 and the third metals 46 are disposed towards the inner side by a distance corresponding to spaces SP. The second and third metals 45 and 46 are disposed thus to overcome the problem in which, for example, when the second and third metals exist within the spaces SP and the size of an actual exit pupil is larger than an expected size (that is, a design size), it is possible for light beams from unexpected portions to strike and to be reflected by the second and third metals, thereby adversely affecting pupil division.

By virtue of each AF pixel pair 11$f$ having the above-described structure, exit pupil division is performed at the exit pupil, that is, the light beam Ta from the left portion Qa of the exit pupil is transmitted through the microlens ML and the transparent color filter Ft and is received by the photoelectric converter PD of the second AF pixel 11$b$, and the light beam Tb from the right portion Qb of the exit pupil is transmitted through the microlens ML and the filter Ft and is received by the photoelectric converter PD of the first AF pixel 11*a*. In other words, in each AF pixel pair 11*f*, the light beams Ta and Tb of an object transmitted through the pair of portions Qa and Qb (that is, left and right portions) inclined horizontally in opposite directions in the exit pupil of the interchangeable lens 2 are received.

Hereunder, reception data obtained at each first AF pixel 11*a* is called "A-series data," and reception data obtained at each second AF pixel 11*b* is called "B-series data." The principles of the phase difference AF will be described with reference to, for example, FIGS. 10 to 14 in which the A-series data and the B-series data obtained from a group of the AF pixel pairs 11*f* disposed in one AF line Lf (FIG. 6) will be described.

Figure 10:
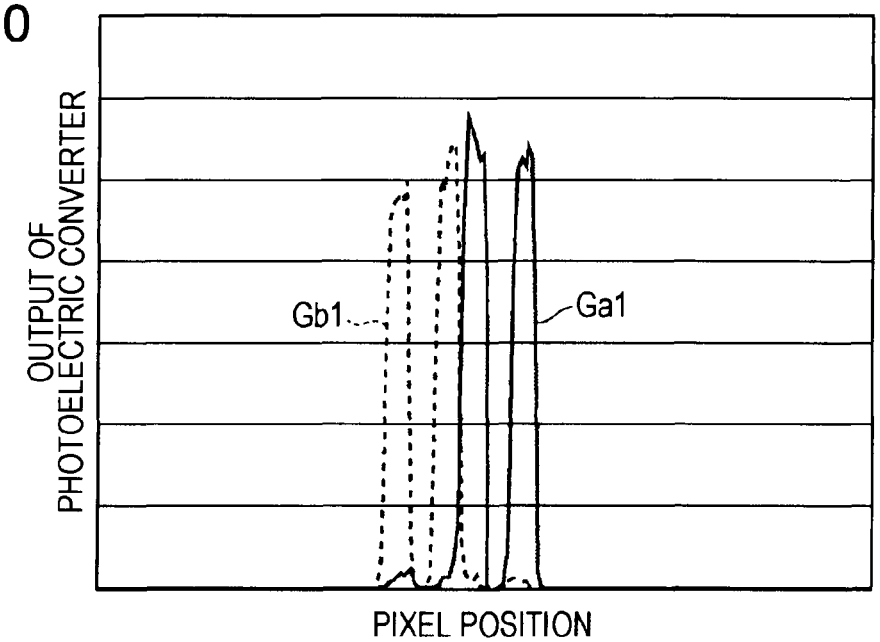
FIG. 10 is a graph of simulation results when a focal plane is defocused to a near side of 200 μm from an image pickup surface of the image pickup element 101.
Figure 11:
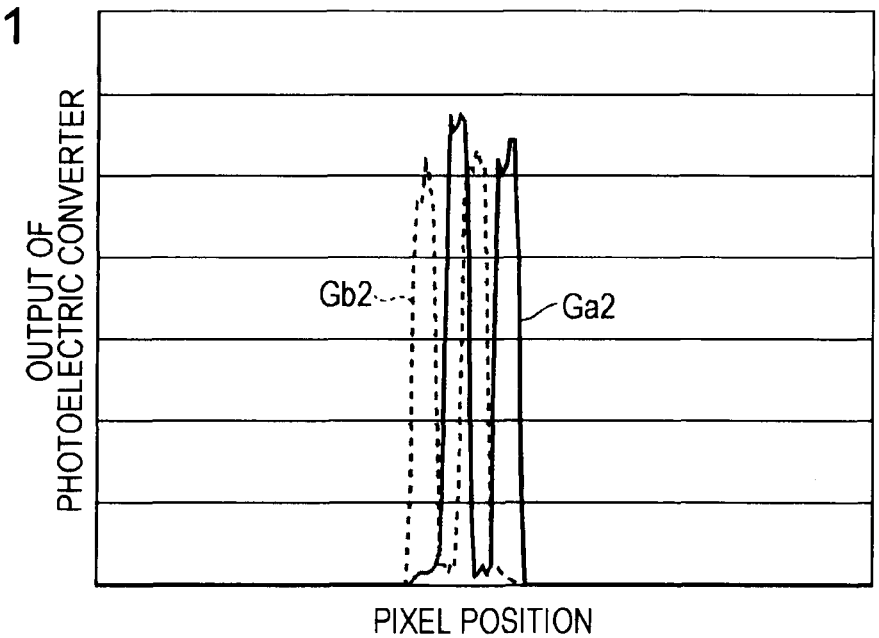
FIG. 11 is a graph of simulation results when the focal plane is defocused to a near side of 100 μm from the image pickup surface.
Figure 12:
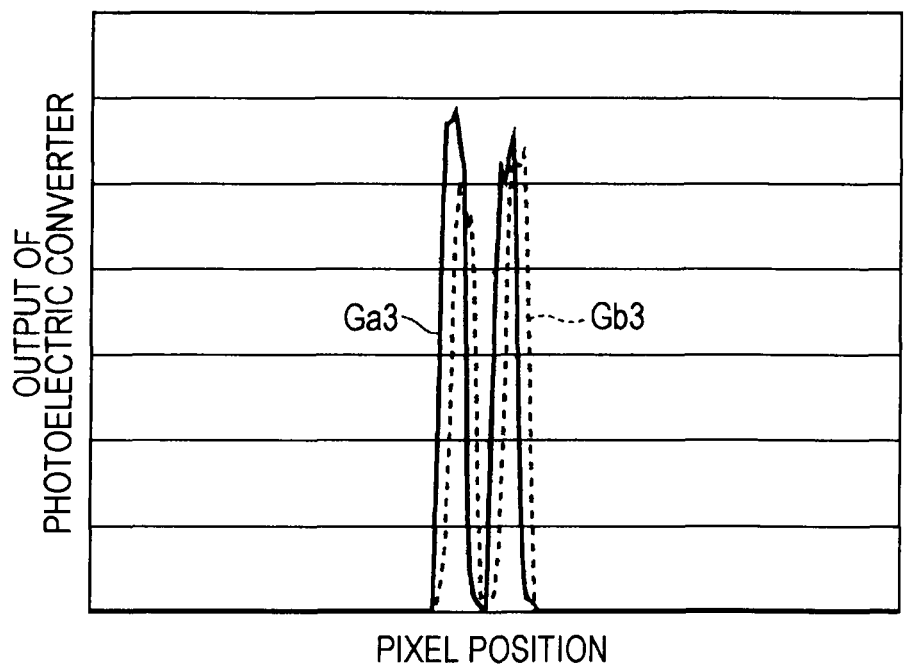
FIG. 12 is a graph of simulation results in a focused state when the focal plane matches the image pickup surface.
Figure 13:
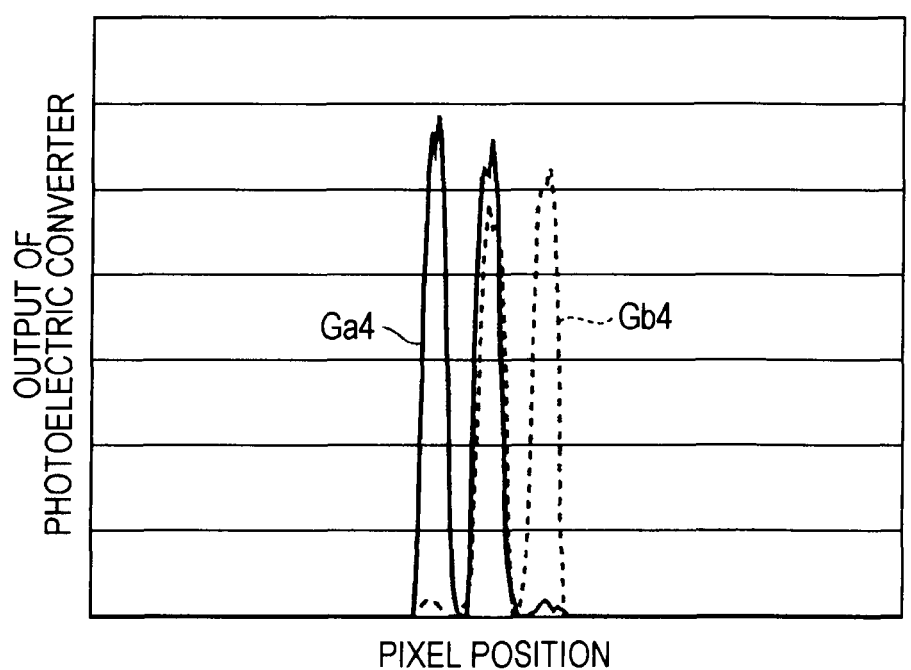
FIG. 13 is a graph of simulation results when the focal plane is defocused to a far side of 100 μm from the image pickup surface.
Figure 14:
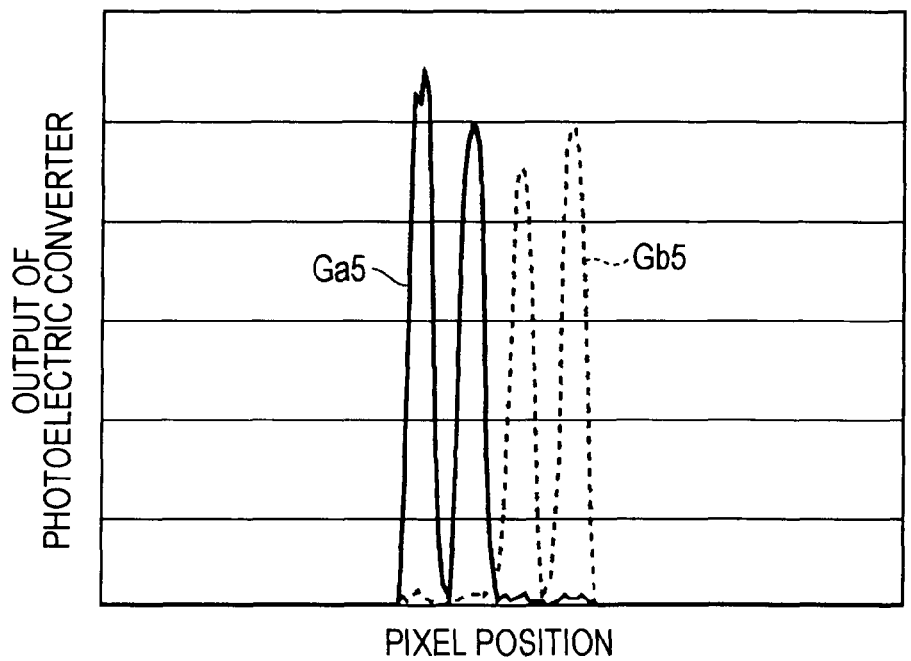
FIG. 14 is a graph of simulation results when the focal plane is defocused to a far side of 200 μm from the image pickup surface.

FIG. 10 is a graph of simulation results when a focal plane is defocused to a near side of 200 μm from the image pickup surface 101*f* of the image pickup element 101. FIG. 11 is a graph of simulation results when the focal plane is defocused to a near side of 100 μm from the image pickup surface 101*f*. Further, FIG. 12 is a graph of simulation results in a focused state when the focal plane matches the image pickup surface 101*f*. Further, FIG. 13 is a graph of simulation results when the focal plane is defocused to a far side of 100 μm from the image pickup surface 101*f*. FIG. 14 is a graph of simulation results when the focal plane is defocused to a far side of 200 μm from the image pickup surface 101*f*. Here, in FIGS. 10 to 14, the horizontal axis represents the pixel positions of the first AF pixels 11*a* and the second AF pixels 11*b* in the direction of an AF line Lf, and the vertical axis represents the outputs from the photoelectric converters PD of the respective first AF pixels 11*a* and second AF pixels 11*b*. Further, in FIGS. 10 to 14, graphs Ga1 to Ga5 (illustrated by solid lines) represent the A-series data, and graphs Gb1 to Gb5 (illustrated by broken lines) represent the B-series data.

In FIGS. 10 to 14, when image sequences of the respective pieces of the A-series data represented by the A-series graphs Ga1 to Ga5 and image sequences of the respective pieces of the B-series data represented by the B-series graphs Gb1 to Gb5 are compared with each other, it can be seen that, the larger the defocusing amount, the larger is a shift amount (displacement amount) in the direction of the AF line Lf (horizontal direction) between the image sequences of the pieces of the A-series data and the image sequences of the pieces of the B-series data.

Figure 15:
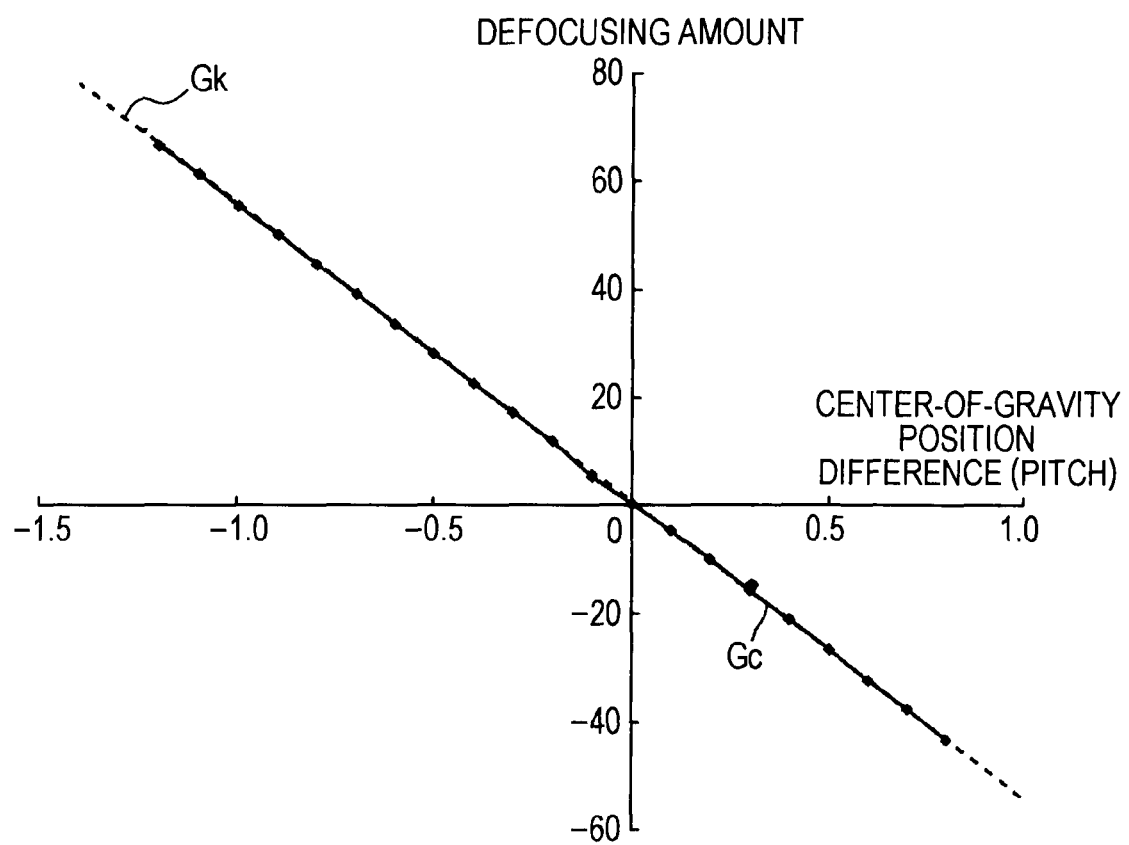
FIG. 15 is a graph Gc illustrating the relationship between a defocusing amount and a difference between center-of-gravity positions in a pair of image sequences.

The relationship between the defocusing amount and the shift amount in such pairs of image sequences (that is, the image sequences of the A-series data and those of the B-series data) is represented by a graph Gc shown in FIG. 15. In FIG. 15, the horizontal axis represents the difference of a center-of-gravity position of the image sequence of the B-series data from a center-of-gravity position of the image sequence of the A-series data (that is, a pixel pitch), and the vertical axis represents the defocusing amount (μm). A center-of-gravity position $X_g$ of each image sequence is obtained using, for example, the following Formula (1):

[Formula 1]

$$Xg = \frac{X_1 Y_1 + X_2 Y_2 + \ldots + X_n Y_n}{Y_1 + Y_2 + \ldots + Y_n} \quad (1)$$

However, in the aforementioned Formula (1), $X_1$ to $X_n$ represent, for example, the pixel positions from the left end in an AF line Lf, and $Y_1$ to $Y_n$ represent the output values of the first AF pixels 11*a* and the second AF pixels 11*b* of each of the positions $X_1$ to $X_n$.

As shown by the graph Gc shown in FIG. 15, the defocusing amount and the difference between the center-of-gravity positions of the pair of image sequences are proportional to each other. This relationship is represented by the following Formula (2), where the defocusing amount is DF (μm) and the difference between the center-of-gravity positions is C(μm).

[Formula 2]

$$DF = k \times C \quad (2)$$

Here, the coefficient k in the Formula (2) represents an inclination Gk (illustrated by a broken line) of the graph Gc shown in FIG. 15, and can be previously obtained by, for example, a test in a factory.

Accordingly, after the phase difference AF calculating circuit 77 obtains the difference between the center-of-gravity positions (the phase difference) of the A-series data and the B-series data obtained from the AF pixel pairs 11*f*, it is possible to perform autofocus (AF) control in which the defocusing amount is calculated using the Formula (2), and the focus lens 211 is provided with a driving amount corresponding to the calculated defocusing amount, to move the focus lens 211 to a detected focus position. Furthermore, the relationship between the defocusing amount and the driving amount of the focus lens 211 is uniquely determined on the basis of a design value of the interchangeable lens 2 mounted to the camera body 10.

In the above-described image pickup device 1, the image pickup element (the image pickup element having a phase difference detection function) 101 is formed so as to include AF lines Lf in which members above the photoelectric converters PD are shifted by half a pitch in the horizontal direction compared with those in the arrangement of the ordinary pixels 110 shown in FIG. 7, and a light-intercepting section LS (FIG. 8) is provided for every other pixel. As a result, the image pickup element 101 can perform precise focus detection using the phase difference detection method, and can be properly manufactured even if pixels become finer. In addition, compared to the type that performs pupil division by limiting light beams of an object at small openings of the metallic layers (light-intercepting masks) as they are in the image pickup element provided with a phase difference detection function discussed in the aforementioned Patent Document 2, cutting off of necessary light beams can be restricted, thereby making it possible to restrict a reduction in the sensitivity at the photoelectric converters. Further, in the image pickup element provided with a phase difference detection function discussed in the aforementioned Patent Document 2, ghost flares may occur because the metallic layers having the small openings project out and become uncovered above the photoelectric converters. However, in the image pickup element 101 according to the embodiment, it is possible to prevent ghost flares because the black filters Fb are disposed on top of the first metals (metallic layers) 44.

<Second Embodiment>

An image pickup device 1A according to a second embodiment of the present invention has structural features that are similar to those of the image pickup device 1 shown in FIGS. 1 to 4. The image pickup device 1A differs from the image pickup device 1 in the structure of an image pickup element.

That is, in the image pickup element 101A of the image pickup device 1A, the structure of each AF area Efr (FIG. 5) provided in accordance with a matrix in an image pickup surface 101*f* differs. The structure of each AF area Efr will be described in detail below.

Figure 16:
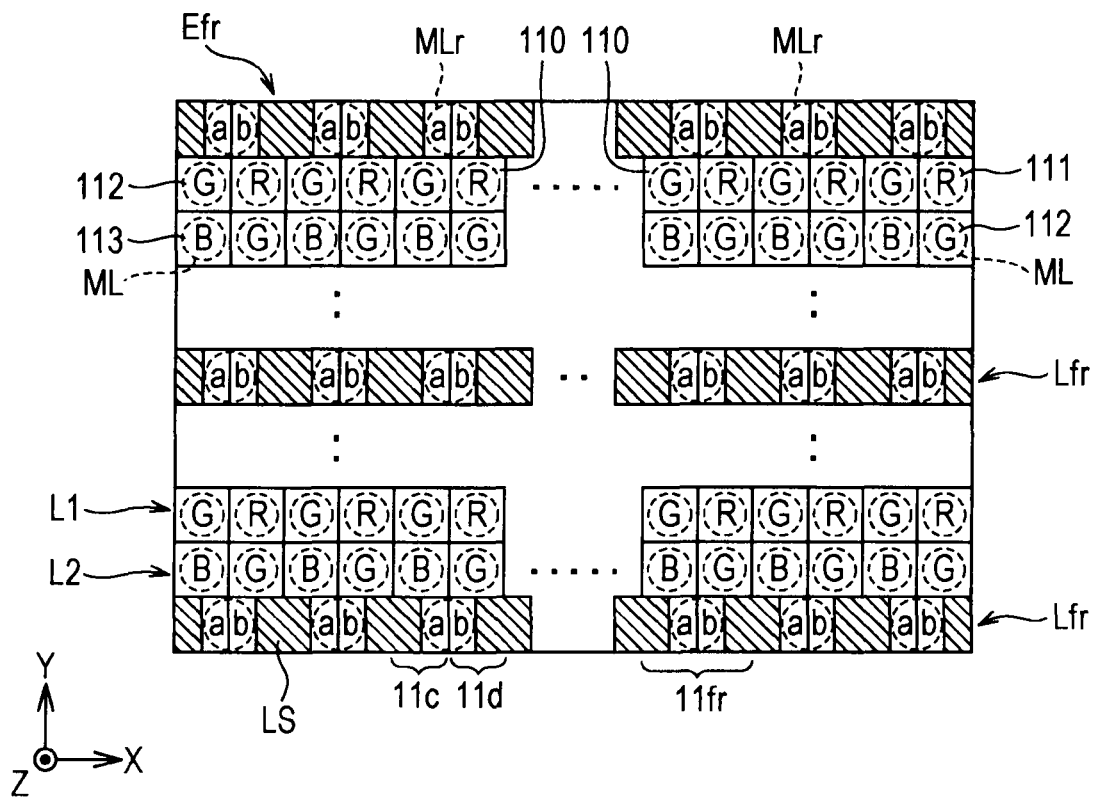
FIG. 16 illustrates the structure of an AF area Efr prescribed for an image pickup element 101A according to a second embodiment of the present invention.

FIG. 16 illustrates the structure of an AF area Efr prescribed for the image pickup element 101A.

In the AF area Efr according to the embodiment, Gr lines L1 and Gb lines L2, which are horizontal lines of ordinary pixels 110 having the same structure as those in the first embodiment, are formed. In each AF line Lfr formed in the AF area Efr, microlenses MLr, whose diameters are larger than those of the microlenses ML disposed at the ordinary pixels 110 and the microlenses ML disposed at the AF lines Lf in the first embodiment, are provided. AF pixel pairs 11*fr* provided with microlenses MLr having such a structure will be described below.

Figure 17:
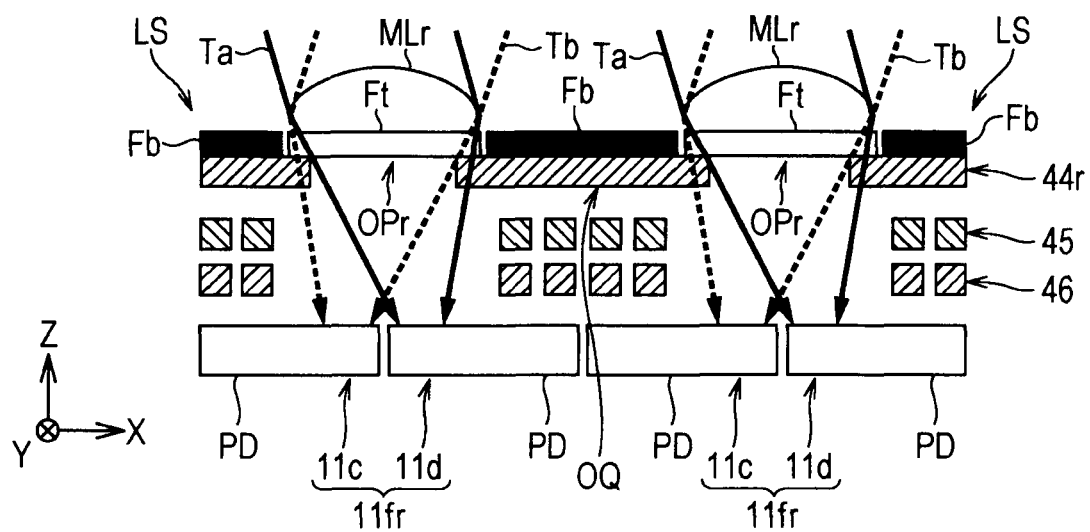
FIG. 17 is a vertical sectional view illustrating the structures of AF pixel pairs 11fr.

FIG. 17 corresponds to FIG. 8, and is a vertical sectional view illustrating the structure of the AF pixel pairs 11*fr*.

Each Af pixel pair 11*fr* includes pixels 11*c* and 11*d*. The Af pixel pairs 11*fr* are provided with photoelectric converters PD, second metals 45, third metals 46, transparent color filters Ft, and black color filters Fb, which have similar structures to those of the AF pixel pairs 11*f* according to the first embodiment. In contrast, unlike the first embodiment, each first metal 44*r* is provided with the aforementioned large microlens MLr and a large opening OPr corresponding to the microlens MLr. The size of the opening OPr of its corresponding first metal 44*r* is slightly smaller than its corresponding transparent filter Ft, and is larger than that of each opening OP of the corresponding ordinary pixel 110 and that of each opening OP according to the first embodiment shown in FIG. 8. That is, the openings OPr of the first metals (light-intercepting masks) 44*r* that are larger than the openings OP formed below the corresponding microlenses ML at the corresponding ordinary pixels 110 are formed below the corresponding microlenses MLr in the AF line Lfr.

Here, for the microlenses MLr of the Af pixel pairs 11*fr*, it is desirable not only to simply make their diameters larger than those of the microlenses ML of the ordinary pixels 110, but also to make their curvatures large (that is, to make their curvature radii small), to increase the precision of pupil division. This will be described with reference to FIG. 18.

Figure 18:
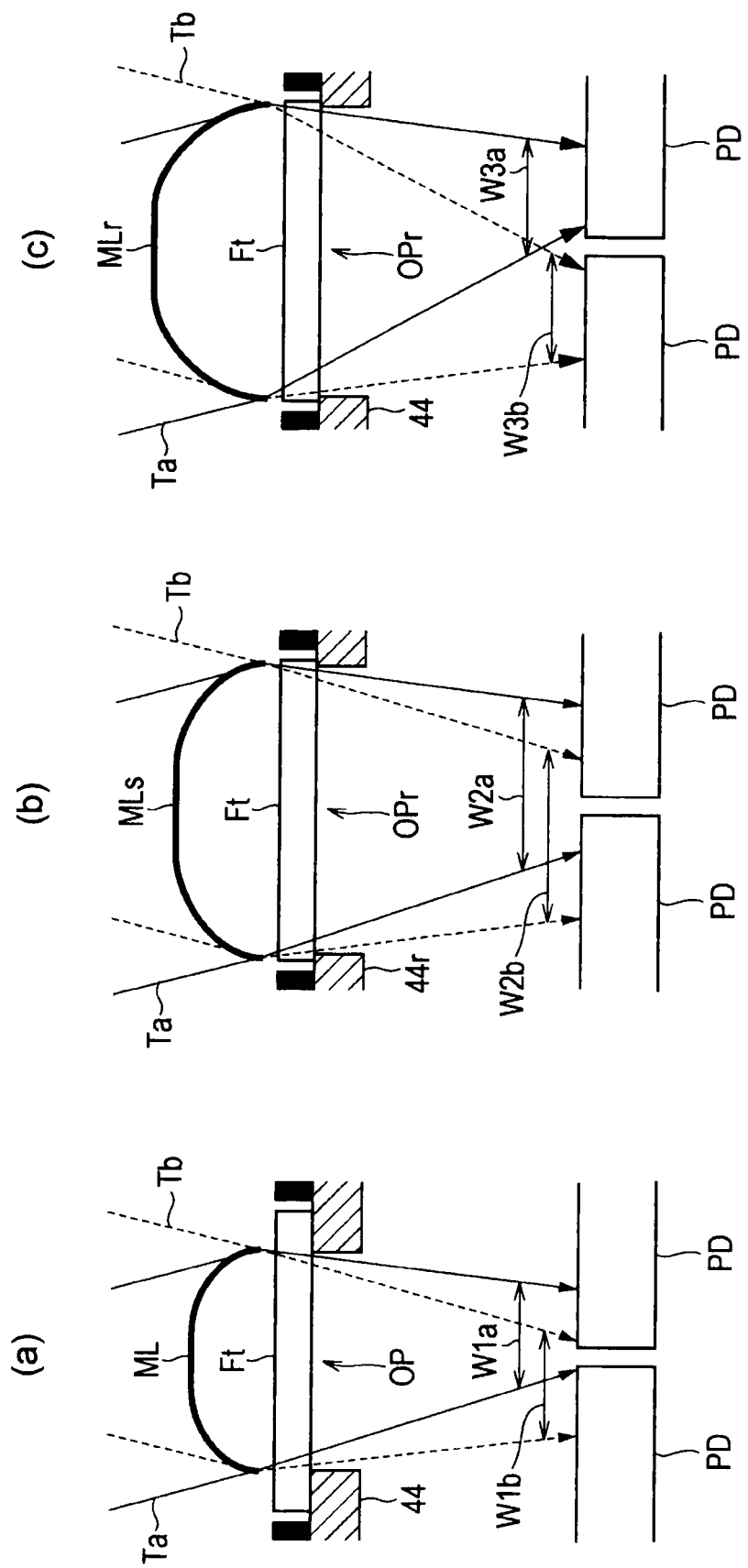
FIG. 18 shows the relationship between the diameter/curvature of a microlens and pupil division.

FIG. 18 shows the relationship between the diameter/curvature of a microlens and pupil division.

FIG. 18(*a*) shows a state of pupil division when, for example, a microlens ML of an ordinary pixel 110, such as that in the first embodiment, is used in an AF pixel pair 11*f*. Here, at the top surfaces (light-receiving surfaces) of photoelectric converters PD, for example, a light beam Ta from a left portion of an exit pupil and a light beam Tb from a right portion of the exit pupil spread by widths W1*a* and W1*b*, respectively.

Here, in a microlens MLs (FIG. 18(*b*)) that is only made larger than the microlens ML shown in FIG. 18(*a*) to increase light-condensing efficiency, the light beam Ta from the left portion of the exit pupil and the light beam Tb from the right portion of the exit pupil spread by widths W2*a* and W2*b*, which are larger than the widths in FIG. 18(*a*), at the light-receiving surfaces of the photoelectric converters PD in correspondence with the increase in the diameter of the microlens ML.

Accordingly, to restrict the spreading of the light beams Ta and Tb at the light-receiving surfaces shown in FIG. 18(*b*), a microlens MLr (see FIG. 18(*c*)) whose curvature is larger than that of the microlens ML of the ordinary pixel 110 may be provided. In the microlens MLr, in correspondence with its curvature being larger than that of the microlens ML, the light beam Ta from the left portion of the exit pupil and the light beam Tb from the right portion of the exit pupil spread only by widths W3*a* and W3*b* at the light-receiving surfaces of the photoelectric converters PD. As a result, for example, as shown in FIG. 18(*c*), the light beam Ta from the left portion of the exit pupil can be received by only the right photoelectric converter PD, and the light beam Tb from the right portion of the exit pupil can be received by only the left photoelectric converter PD. Therefore, the precision of the phase difference AF operation performed by proper pupil division is increased.

The image pickup device 1A including the image pickup element 101A having the above-described structure and provided with a phase difference detection function provides advantages similar to those of the first embodiment. In addition, in the image pickup element 101A, since the openings OPr of the first metals 44*r* and the diameters of the microlenses MLr of the AF pixel pairs 11*fr* are larger than the openings OP of the first metals 41 and the microlenses ML of the ordinary pixels 110, the sensitivity of the pixels in the AF pixel pairs 11*f* is increased.

<Modifications>

Figure 19:
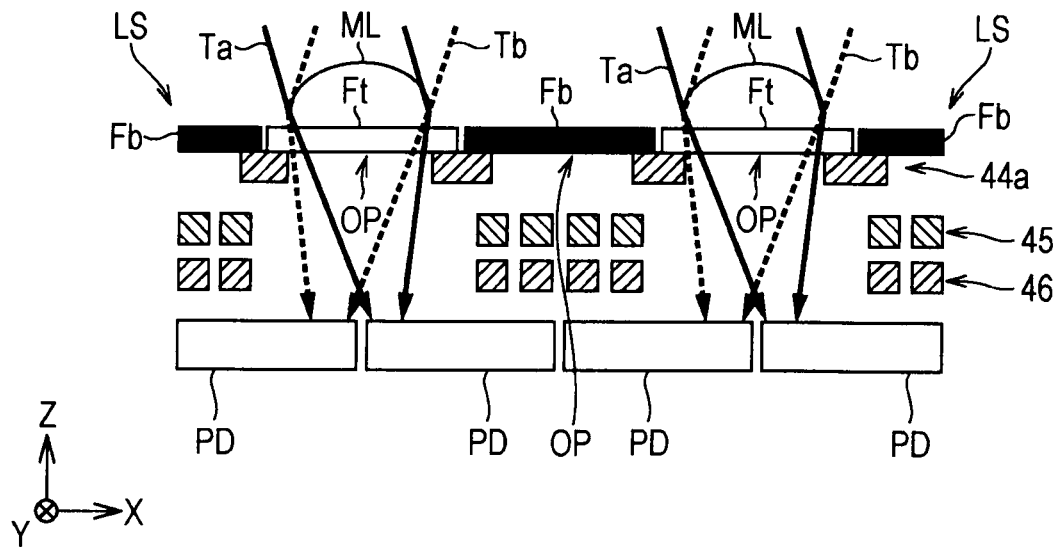
FIG. 19 illustrates the structure of first metals 44a according to a modification of the present invention.

In the image pickup element according to the first embodiment, it is not necessary to use a first metal 44 at which the location OQ directly below the black filter Fb is blocked as it is in FIG. 8. As shown in FIG. 19, a first metal 44*a* at which an opening OP is formed directly below a black filter Fb may be used. In this case, in order to reduce the amount of light (transmitted through the black filter Fb) that is received by a photoelectric converter PD disposed directly below the black filter Fb, it is desirable that the black filter Fb have low transmittance (for example, 3% or less). If the opening OP is formed directly below the black filter Fb in this way, even in an AF line Lf, it is possible to form openings OP in first metals at pitches that are the same as those in the arrangement of the ordinary pixels 110, so that the layout of the first metals in the ordinary pixels 110 may be used. Furthermore, the first metals 44*a* having the openings OP formed directly below the black filters Fb as shown in FIG. 19 may also be used in the image pickup element according to the second embodiment.

In contrast, in each of the above-described embodiments, the black filters Fb in the structures shown in FIGS. 8 and 17 may be omitted. In this case, ghost flares may occur due to the uncovered first metals as described above. However, it is possible to mitigate this problem by, for example, coloring the top surfaces of the first metals black or using electrically conductive layers formed of black electrically conductive materials as the first metals.

Figure 20:
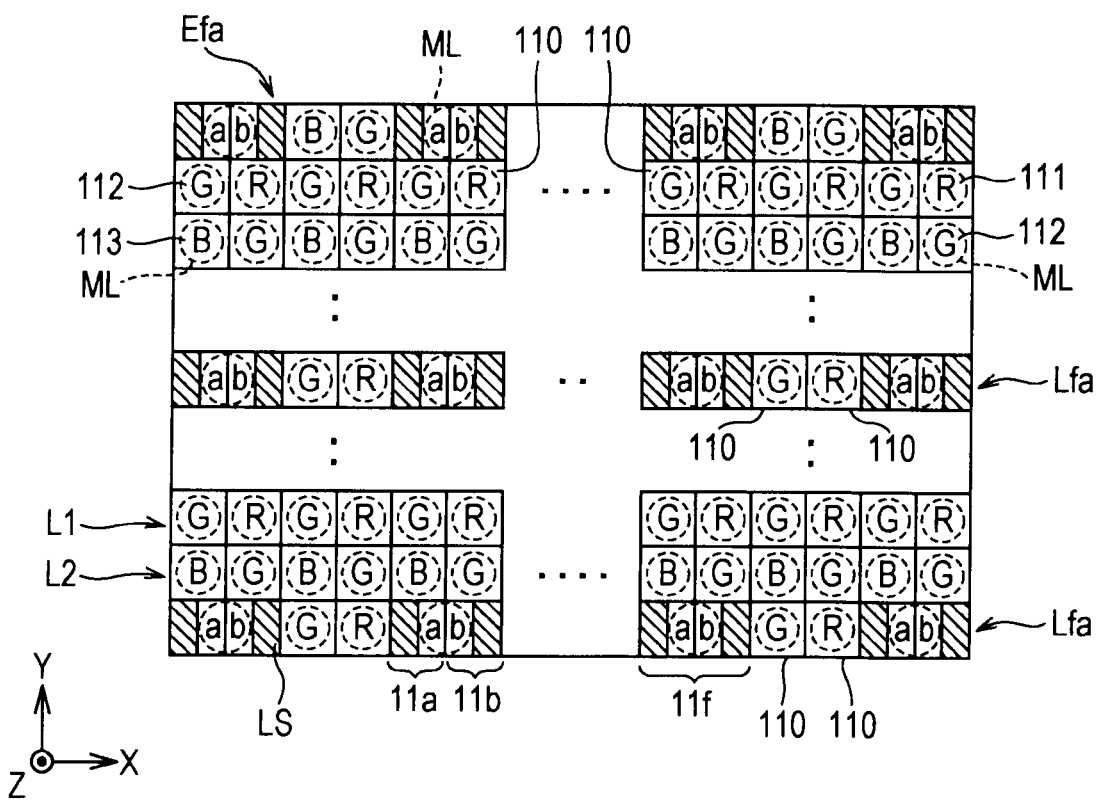
FIG. 20 illustrates the structure of an AF area Efa according to a modification of the present invention.

In the image pickup element according to the first embodiment, it is not necessary to use an AF area Ef having AF lines Lf only including AF pixel pairs 11*f* shown in FIG. 6. An AF area Efa having AF lines Lfa in which ordinary pixels 110 are interposed between Af pixel pairs 11*fa* may be used as shown in FIG. 20. In this case, interpolation can be performed on image information of an object that is missing at any Af pixel pair 11*f* using image information of the ordinary pixels 110 inserted in the AF lines LFa. Therefore, image quality is increased. Ordinary pixels 110 may also be inserted between AF pixel pairs 11*fa* in an AF line Lfa as shown in FIG. 20 in the image pickup element according to the second embodiment.

In each of the above-described embodiments, it is not necessary to use an AF line in which an opening OP is provided for every other opening OP of the first metals 41 formed in a horizontal line of the ordinary pixels 110. It is possible to use an AF line in which an opening OP is provided for every two or at least every three openings OP.

In the AF lines in the above-described embodiments, it is not necessary to shift the members (the microlenses and the color filters) above the photoelectric converters PD by half a pitch with respect to those in the horizontal lines of the ordinary pixels 110. It is possible to keep the members above the photoelectric converters PD as they are and shift the photoelectric converters PD by half a pitch with respect the horizontal lines of the ordinary pixels 110. By shifting the members above the photoelectric converters PD by half a pitch relative to the photoelectric converters PD, it is possible to provide the advantages according to each of the above-described embodiments.

In each of the above-described embodiments, it is not necessary to provide the image pickup element 101 including the AF lines Lf in a signal-lens reflex digital camera. It may be provided in a compact digital camera.

For the AF pixel pairs in each of the above described embodiments, it is not necessary to provide transparent color filters above the openings OP of the first metals 44. From the viewpoint of attaching importance to focusing precision, a green color filter having excellent luminosity factor may be used. Alternatively, a red color filter or a blue color filter may also be used.

In each of the above-described embodiments, the microlenses may be disposed above the black filters Fb. If the microlenses are disposed thus, it is possible to dispose the microlenses at the same pitch as that in the arrangement of the ordinary pixels 110, so that a layout design of the microlenses in the ordinary pixels 110 can be used.

In each of the above-described embodiments, it is not necessary to provide a shift of half a pitch (50% pitch) suitable for a proper balance of outputs from each pixel of the AF pixel pairs 11f. For example, it is possible to provide a shift of any pitch (such as an approximately 40% pitch). In this case, the balance between the outputs of the first AF pixels and the second AF pixels is lost because the exit pupil is not divided in half. However, it is possible to balance the outputs by, for example, multiplying gain β to the pixel output having a smaller light reception amount. The gain β is based upon, for example, an area ratio of each portion of the exit pupil that receives light at the respective pixels.

The term "half a predetermined pitch" in the present invention obviously refers to a pitch of 50% with respect to the predetermined pitch and to pitches within (50±γ) % that considers a variation amount γ of, for example, manufacturing errors with respect to the 50% pitch.

REFERENCE SIGNS LIST 1, 1A image pickup device
2 interchangeable lens
10 camera body
11a, 11c first AF pixel
11b, 11d second AF pixel
11f, 11fr AF pixel pair
41, 44, 44a, 44r first metal
42, 45 second metal
43, 46 third metal
62 main controlling section
77 phase difference AF calculating circuit
101, 101A image pickup element
101f image pickup surface
110 ordinary pixel
Ef, Efa, Efr AF area
Fb black color filter (black filter)
Lf, Lfa, Lfr AF line
ML, MLr microlens
Qa left portion of exit pupil
Qb left portion of exit pupil
PD photoelectric converter

The invention claimed is:

1. An image pickup element comprising:
a pair of first pixels that perform a pupil division function by receiving an object light beam transmitted through a pair of portions inclined in opposite directions along a predetermined direction in an exit pupil of a shooting optical system; and
a second pixel group including second pixels that are not provided with the pupil division function,
wherein the second pixel group includes
a plurality of photoelectric converters disposed at a predetermined pitch along the predetermined direction, and
a plurality of microlenses provided above the respective photoelectric converters,
wherein the pair of first pixels include
a pair of photoelectric converters having the same size as the plurality of photoelectric converters, the pair of photoelectric converters being disposed adjacent to each other at the predetermined pitch along the predetermined direction, and
wherein a light-intercepting section and one microlens are provided above the pair of photoelectric converters, the light-intercepting section having two light-intercepting areas that intercept the light beam transmitted through the exit pupil, the one microlens being interposed between the two light-intercepting areas.

2. The image pickup element according to claim 1, wherein a first-pixel-pair arrangement in which a plurality of the pairs of first pixels are disposed adjacent to each other along the predetermined direction is provided,
wherein a relationship in an arrangement between the one microlens and each pair of photoelectric converters in the first-pixel-pair arrangement corresponds to that in an arrangement configuration when predetermined microlenses among the plurality of microlenses are relatively shifted by a predetermined amount in the predetermined direction with respect to the plurality of photoelectric converters in the second pixel group, and
wherein the first-pixel-pair arrangement includes a plurality of the light-intercepting sections between the predetermined microlenses that are adjacent to each other in the arrangement configuration.

3. The image pickup element according to claim 2, wherein the predetermined amount is half of the predetermined pitch.

4. The image pickup element according to claim 2, wherein an interval between the plurality of the light-intercepting sections provided between the microlenses that are adjacent to each other in the first-pixel-pair arrangement is equal to a distance between every other pixel in an arrangement of the second pixels disposed in the predetermined direction in the second pixel group.

5. The image pickup element according to claim 1, wherein, in the light-intercepting section, the light beam is intercepted by a black color filter.

6. The image pickup element according to claim 1, wherein, in the light-intercepting section, the light beam is intercepted by a predetermined metallic layer.

7. The image pickup element according to claim 1, wherein the diameter of the one microlens is larger than the diameters of the plurality of microlenses.

8. The image pickup element according to claim 7, wherein first openings of light-intercepting masks are provided below the plurality of microlenses, and
wherein a second opening of a light-intercepting mask that is larger than the first openings is provided below the one microlens.

9. The image pickup element according to claim 1, wherein the curvature of the one microlens is larger than the curvatures of the plurality of microlenses.

10. An image pickup device comprising:
a shooting optical system; and
an image pickup element that receives an object light beam transmitted through an exit pupil of the shooting optical system, wherein the image pickup element includes
- a pair of first pixels that perform a pupil division function by receiving an object light beam transmitted through a pair of portions inclined in opposite directions along a predetermined direction in the exit pupil; and
- a second pixel group including second pixels that are not provided with the pupil division function, wherein the second pixel group includes
- a plurality of photoelectric converters disposed at a predetermined pitch along the predetermined direction, and
- a plurality of microlenses provided above the respective photoelectric converters, wherein the pair of first pixels include
- a pair of photoelectric converters having the same size as the plurality of photoelectric converters, the pair of photoelectric converters being disposed adjacent to each other at the predetermined pitch along the predetermined direction, and wherein a light-intercepting section and one microlens are provided above the pair of photoelectric converters, the light-intercepting section having two light-intercepting areas that intercept the light beam transmitted through the exit pupil, the one microlens being interposed between the two light-intercepting areas.

* * * * *